United States Patent
Lee (10) Patent No.: US 7,903,491 B2
(45) Date of Patent: Mar. 8, 2011

(54) REFRESH SIGNAL GENERATING CIRCUIT

(75) Inventor: Sang Kwon Lee, Yongin-si (KR)

(73) Assignee: Hynix Semiconductor Inc., Icheon-si (KR)

(*) Notice: Subject to any disclaimer, the term of this patent is extended or adjusted under 35 U.S.C. 154(b) by 199 days.

(21) Appl. No.: 12/313,102

(22) Filed: Nov. 17, 2008

(65) Prior Publication Data

US 2009/0323436 A1 Dec. 31, 2009

(30) Foreign Application Priority Data

Jun. 27, 2008 (KR) .................. 10-2008-0061907

(51) Int. Cl.
*G11C 7/00* (2006.01)
(52) U.S. Cl. .................. 365/222; 365/233.1; 365/236
(58) Field of Classification Search .................. 365/222, 365/233.1, 236
See application file for complete search history.

(56) References Cited

U.S. PATENT DOCUMENTS

| 6,665,225 | B2 | 12/2003 | Tsujino | |
|---|---|---|---|---|
| 7,359,269 | B2 | 4/2008 | You | |
| 2003/0185078 | A1* | 10/2003 | Tsukude | 365/222 |

FOREIGN PATENT DOCUMENTS

| KR | 10-2001-0004670 A | 1/2001 |
|---|---|---|
| KR | 10-2001-0057488 A | 7/2001 |
| KR | 10-2004-0100249 A | 12/2004 |
| KR | 10-2004-0102727 A | 12/2004 |

* cited by examiner

*Primary Examiner* — Hoai V Ho
*Assistant Examiner* — Jason Lappas
(74) *Attorney, Agent, or Firm* — John P. White; Cooper & Dunham LLP (57) ABSTRACT

A refresh signal generating circuit of a semiconductor memory device includes a flag signal generator which generates a flag signal in response to a refresh signal and a precharge signal, a clock enable signal buffer which generates first and second buffer enable signals based on an external clock enable signal in response to the flag signal, and a chip select signal buffer which generates an internal chip select signal based on an external chip select signal in response to the flag signal.

10 Claims, 11 Drawing Sheets

REFRESH SIGNAL GENERATING CIRCUIT

TECHNICAL FIELD

The present disclosure relates to a semiconductor memory device and, more particularly, to a refresh signal generating circuit.

BACKGROUND

Recently, a semiconductor memory device has been developed to a high-speed and high-integrated memory with the technical improvement and is used for various products from large size home appliances to small size mobile products.

Such a semiconductor memory device is comprised of a plurality of memory cells on which data signals are recorded, and a data signal is read as '1' or '0' according to the amount of electric charge accumulated in the memory cell. However, since the electric charge accumulated in the memory cell is discharged with the lapse of time, it becomes difficult to determine a data signal as '1' or '0'. For this reason, an auto refresh operation is performed to amplify and record again a data signal recorded in the memory cell at a predetermined time interval.

An auto refresh operation is classified into an All Bank Refresh for refreshing all banks of a chip and a Per Bank Refresh for performing refreshing per bank. Typically, a refresh signal generating circuit is provided in a semiconductor memory device to generate a refresh signal to trigger auto refresh operations.

Figure 1:
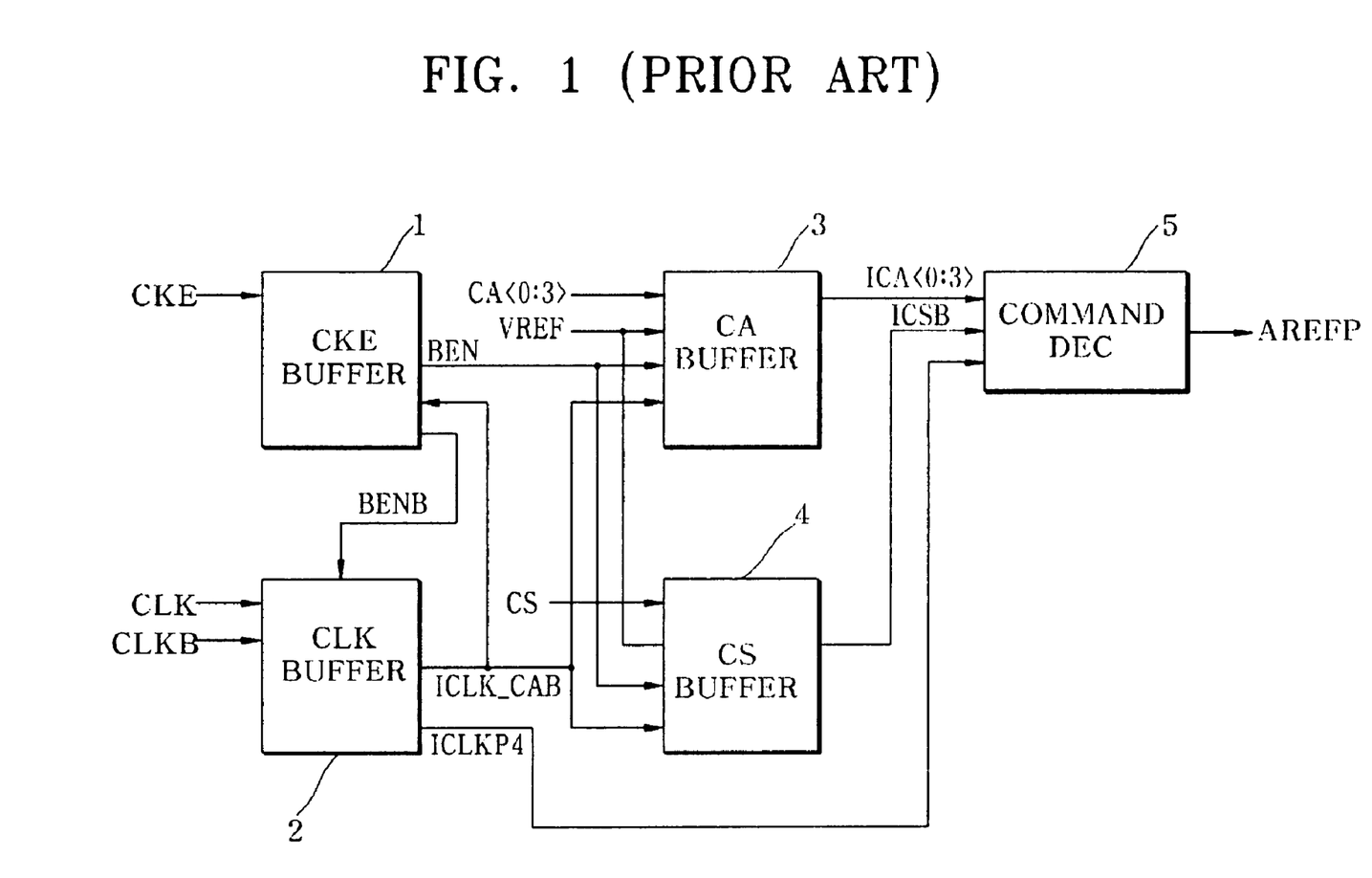
FIG. 1 is a diagram showing a conventional refresh signal generating circuit in a semiconductor memory device.

FIG. 1 is a diagram illustrating a conventional refresh signal generating circuit.

As shown in FIG. 1, the conventional refresh signal generating circuit comprises a clock enable signal buffer 1, a clock buffer 2, a command address buffer 3, a chip select signal buffer 4 and a command decoder 5.

The operation of the refresh signal generating circuit of FIG. 1 is as follows.

First, the clock enable signal buffer 1 generates first and second buffer enable signals BEN and BENB in response to an external clock enable signal CKE.

The clock buffer 2 receives external clocks CLK and CLKB and generates a first internal clock ICLK_CAB and a second internal clock ICLKP4 in response to the second buffer enable signal BENB.

The command address buffer 3 receives external command address signals CA<0:3> and a reference voltage VREF and generates an internal command address signals ICA<0:3> in response to the first internal clock ICLK_CAB from the clock buffer 2. Here, the command address buffer 3 is enabled in response to the first buffer enable signal BEN from the clock enable signal buffer 1. The chip select signal buffer 4 receives an external chip select signal CS and a reference voltage VREF and generates an internal chip select signal ICSB in response to the first internal clock ICLK_CAB. Here, the chip select signal buffer 4 is enabled in response to the first buffer enable signal BEN.

The command decoder 5 receives the internal command address signals ICA<0:3> generated in the command address buffer 3 and the internal chip select signal ICSB generated in the chip select signal buffer 4 and decodes them, to generate an all bank refresh signal AREFP in response to the second internal clock ICLKP4. The all bank refresh operation is performed in all banks of a chip in response to the all bank refresh signal AREFP. In this case, an access for general reading or writing operation is limited in all banks of a chip.

However, the conventional clock buffer 2 and command address buffer 3 maintain an enable state even in an all bank refresh operation, and continues an internal operation in response to toggling external clocks CLK and CLKB and the command address signals CA<0:3>, causing unnecessary current consumption.

BRIEF SUMMARY

In an aspect of the present disclosure, a refresh signal generating circuit is provided that stops an operation of a clock buffer, a command address buffer and a chip select signal buffer by disabling first and second buffer enable signals which control the operation of the clock buffer, command address buffer and chip select signal buffer in an all bank refresh operation, thereby preventing unnecessary current consumption.

In an exemplary embodiment, a refresh signal generating circuit includes a flag signal generator for generating a flag signal in response to a refresh signal and a precharge signal, a clock enable signal buffer for generating first and second buffer enable signals based on an external clock enable signal in response to the flag signal, and a chip select signal buffer for generating an internal chip select signal based on an external chip select signal in response to the flag signal.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF PREFERRED EMBODIMENTS

Hereinafter, examples and exemplary embodiments of the present disclosure will be described with reference to accompanying drawings. However, the examples and embodiments are for illustrative purposes only and are not intended to limit the scope of the invention.

Figure 2:
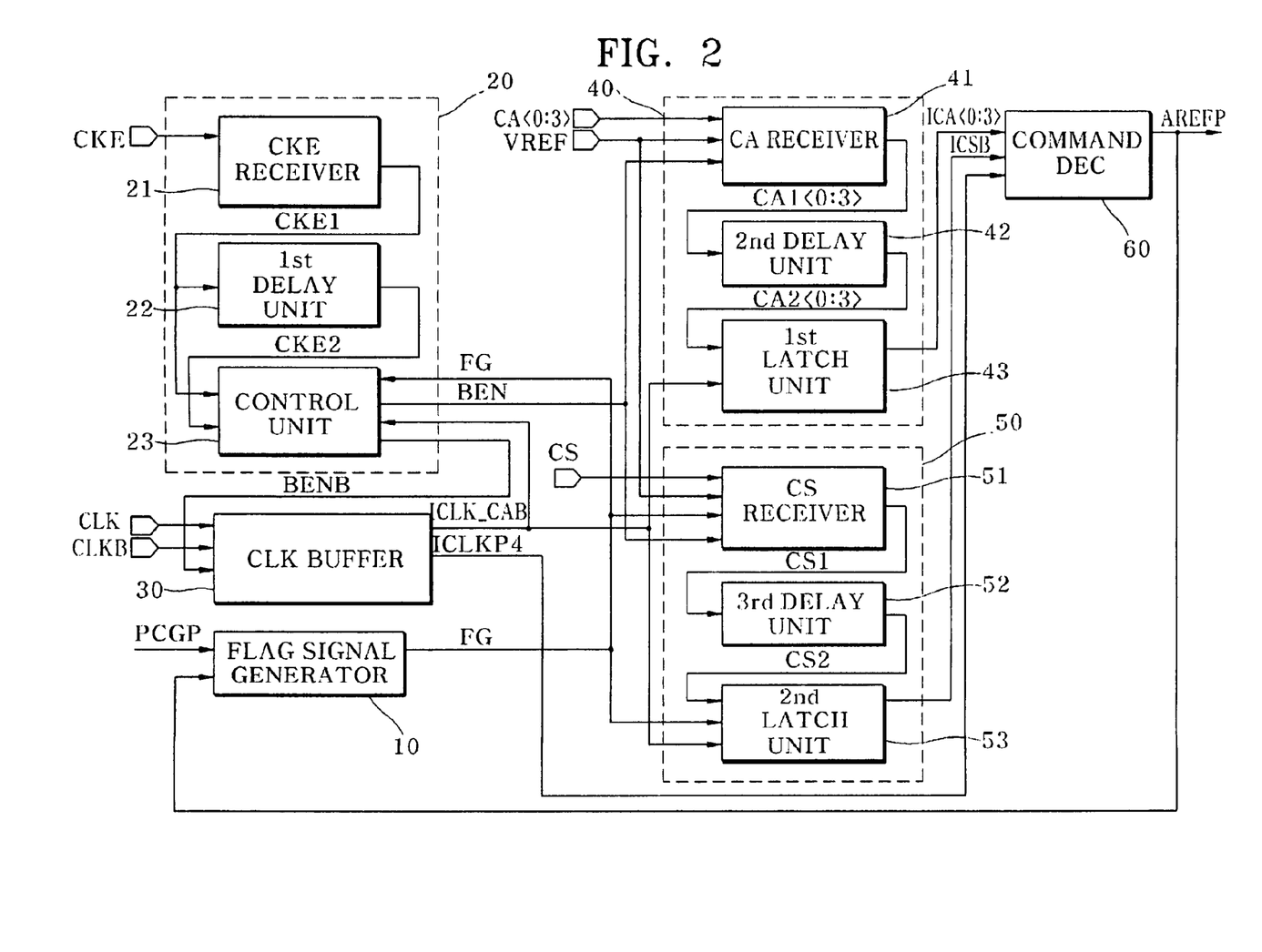
FIG. 2 is a diagram showing a refresh signal generating circuit of a semiconductor memory device according to an exemplary embodiment of the present disclosure.

FIG. 2 is a diagram showing a refresh signal generating circuit of a semiconductor memory device according to an exemplary embodiment of the present disclosure.

The refresh signal generating circuit as illustrated in FIG. 2, comprises a flag signal generator 10, a clock enable signal buffer 20, a clock buffer 30, a command address buffer 40, a chip select signal buffer 50 and a command decoder 60.

Figure 3:
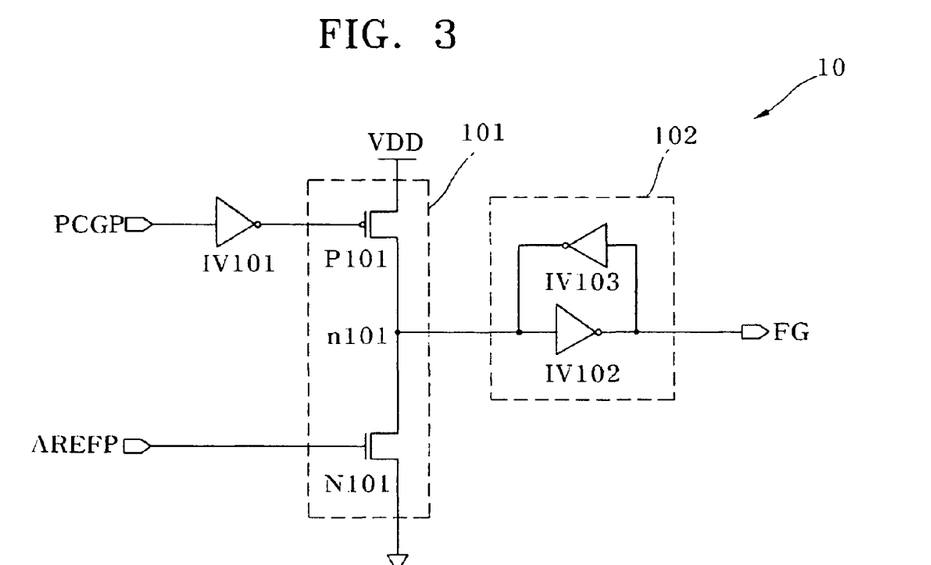
FIG. 3 is a diagram illustrating an example of a flag signal generator in the refresh signal generating circuit of FIG. 2.

The flag signal generator 10 generates a flag signal FG to control the operations of the clock enable signal buffer 20, the command address buffer 40 and the chip select signal buffer 50. As illustrated in FIG. 3, the flag signal generator 10 includes a first driving unit 101 which drives a node n101 in response to an all bank refresh signal AREFP and a precharge signal PCGP, and a latch 102 which latches a signal of the node n101 to generate the flag signal FG. Here, the all bank refresh signal AREFP is a pulse signal of high level which informs a start of the all bank refresh operation, and the precharge signal PCGP is a pulse signal of high level which informs a completion of the all bank refresh operation.

The flag signal generated by the flag signal generator 10 of FIG. 3 is enabled to a high level when the all bank refresh signal AREFP is input and is disabled to a low level when the precharge signal PCGP is input. That is, the flag signal generator 10 generates the flag signal FG of high level to stop the operations of the clock buffer 30, the command address buffer 40 and the chip select signal buffer 50 in the all bank refresh operation, and generates the flag signal FG of low level to resume the operations of the clock buffer 30, the command address buffer 40 and the chip select signal buffer 50 at the completion of the all bank refresh operation.

The clock enable signal buffer 20 includes a clock enable signal receiver 21, a first delay unit 22 and a control unit 23.

Figure 4:
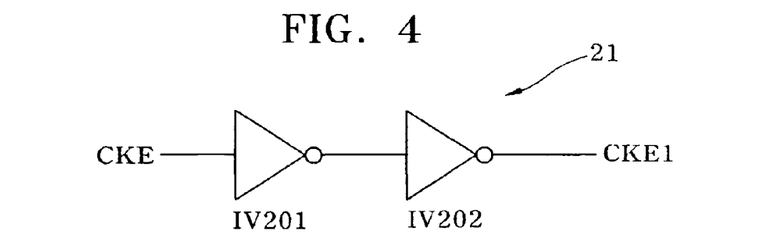
FIG. 4 is a diagram illustrating an example of a clock enable signal receiver in the refresh signal generating circuit of FIG. 2.

An example of the clock enable signal receiver 21 as illustrated in FIG. 4 includes inverters IV201 and IV202 which buffer an external clock enable signal CKE and generate a first clock enable signal CKE1.

The first delay unit 22 delays the first clock enable signal CKE1 to secure a setup/hold time and generates a second clock enable signal CKE2. The first delay unit 22 can be configured as a general delay circuit.

Figure 5:
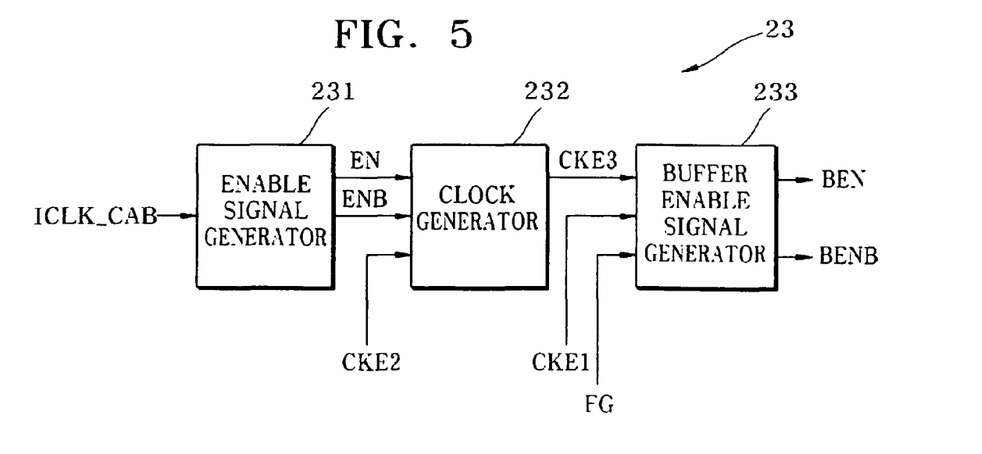
FIG. 5 is a schematic block diagram illustrating an example of a control unit in the refresh signal generating circuit of FIG. 2.

An example of the control unit 23 as illustrated in FIG. 5 includes an enable signal generator 231 which generates enable signals EN and ENB in response to a first internal clock ICLK_CAB of the clock buffer 30, a clock generator 232 which delays the second clock enable signal CKE2 to generate a third clock enable signal CKE3 in response to the enable signals EN and ENB, and a buffer enable signal generator 233 which receives the first clock enable signal CKE1, the third clock enable signal CKE3 and the flag signal FG to generate first and second buffer enable signals BEN and BENB. Here, the first internal clock ICLK_CAB is from the clock buffer 30 which receives the external clocks CLK and CLKB.

Figure 6A:
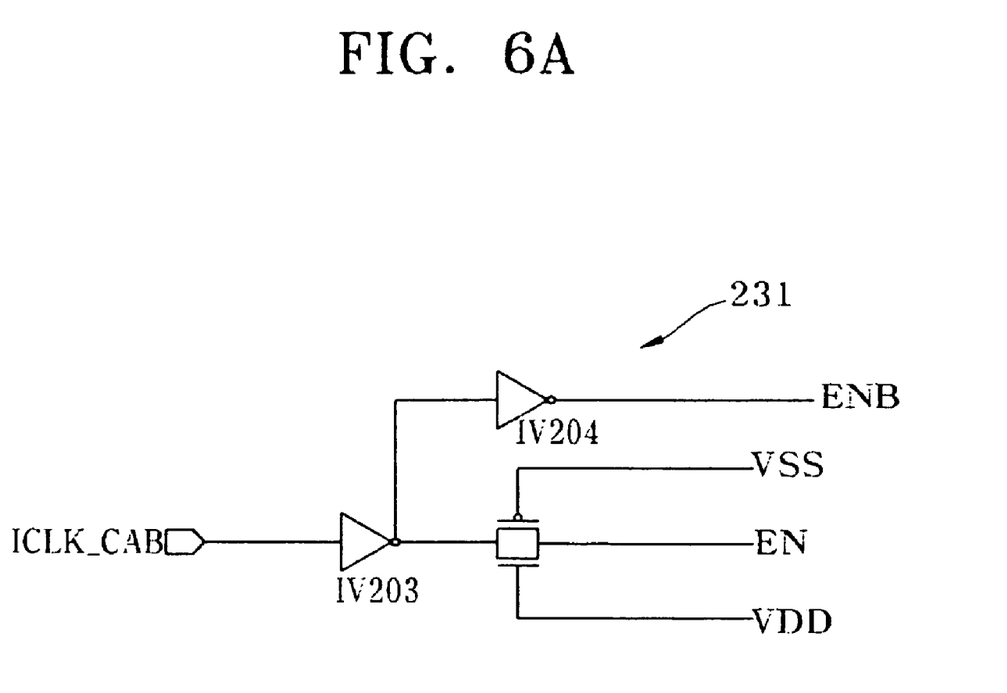
FIG. 6A is a diagram illustrating an example of an enable signal generator of the control unit of FIG. 5.

An example of the enable signal generator 231 as illustrated in FIG. 6A receives the first internal clock ICLK_CAB and generates the enable signals EN and ENB. Here, the enable signals EN and ENB have phases opposite to each other and are toggled in response to the first internal clock ICLK_CAB.

Figure 6B:
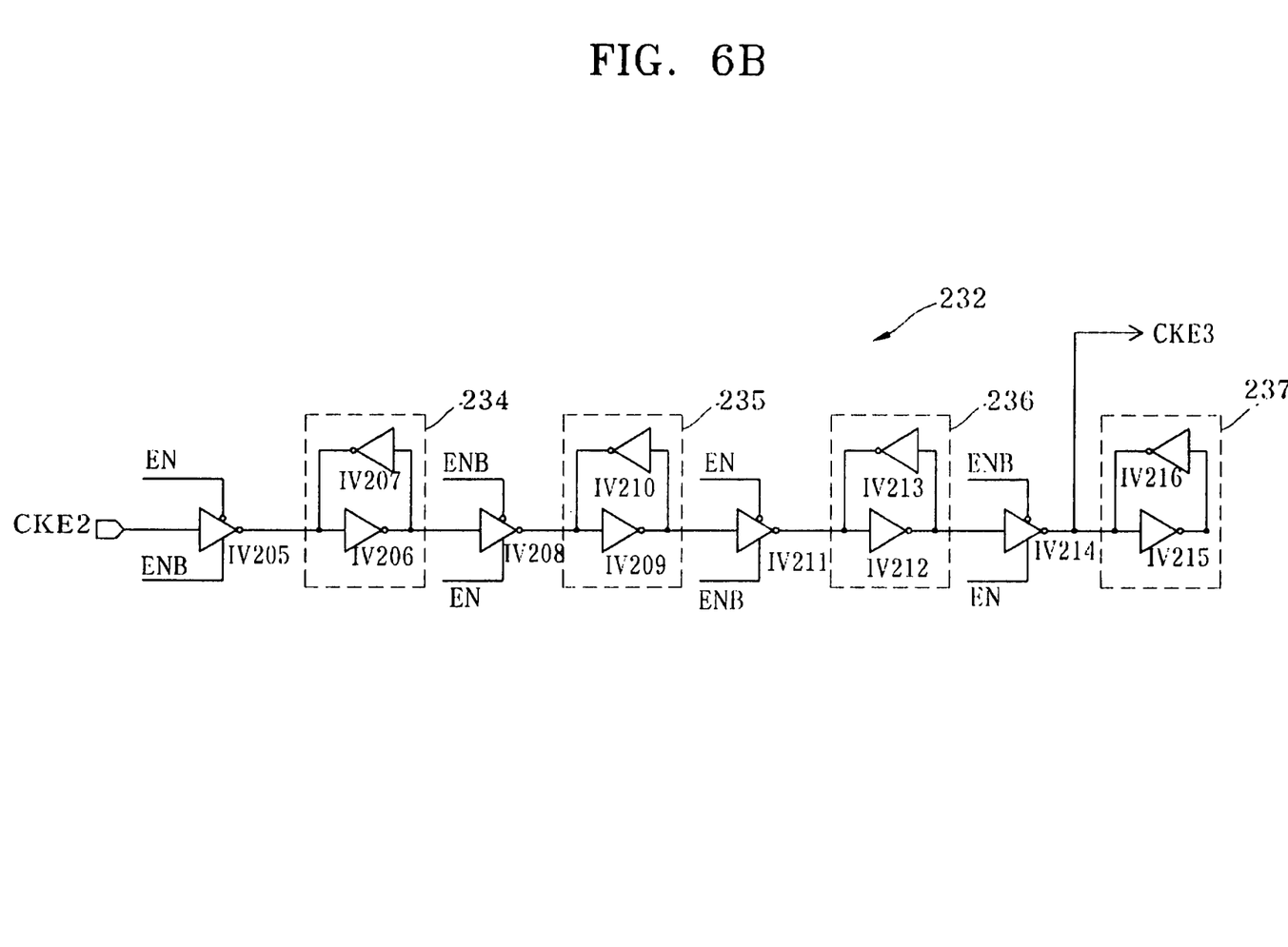
FIG. 6B is a diagram illustrating an example of a clock generator of the control unit of FIG. 5.

The clock generator 232 as illustrated in FIG. 6B includes inverters IV205, IV208, IV211 and IV214 and a plurality of latches 234 to 237 which are selectively turned on in response to the toggled enable signals EN and ENB.

More specifically, when the enable signal EN is in a low level, the second clock enable signal CKE2 is transmitted to the latch 234 through the inverter IV205, to be latched. When the enable signal EN is changed to a high level, the output signal of the latch 234 is transmitted to the latch 235 through the inverter IV208, to be latched. When the enable signal EN is changed to a low level again, the output signal of the latch 235 is transmitted to the latch 236 through the inverter IV211, to be latched. When the enable signal EN is changed to a high level again, the output signal of the latch 236 is transmitted to the latch 237 through the inverter IV214, to be latched, and is transmitted to the buffer enable signal generator 233 as the third clock enable signal CKE3. That is, the third clock enable signal CKE3 is a signal generated by delaying and inverting the second clock enable signal CKE2 by two cycles of the enable signals EN and ENB.

Figure 6C:
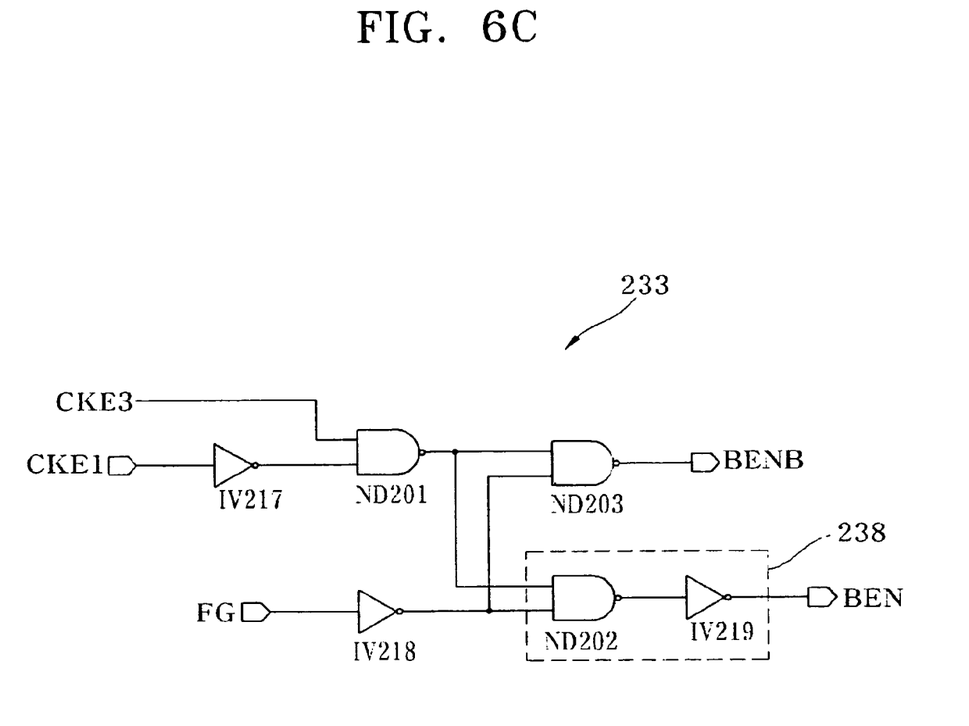
FIG. 6C is a diagram illustrating an example of a buffer enable signal generator of the control unit of FIG. 5.

The buffer enable signal generator 233 as illustrated in FIG. 6C includes a NAND gate ND201 which receives an inverse signal of the first clock enable signal CKE1 and the third clock enable signal CKE3 and performs a NAND operation, a first logic unit 238 which receives an output signal of the NAND gate ND201 and an inverse signal of the flag signal FG and performs an AND operation to generate the first buffer enable signal BEN, and a NAND gate ND203 which receives an output signal of the ND201 and an inverse signal of the flag signal FG and performs a NAND operation to generate the second buffer enable signal BENB. Here, the first buffer enable signal BEN is a signal for controlling the operations of the command address buffer 40 and the chip select signal buffer 50, and the second buffer enable signal BENB is a signal for controlling the operation of the clock buffer 30.

The buffer enable signal generator 233 of FIG. 6C generates the first and second buffer enable signals BEN and BENB for operating the clock buffer 30, the command address buffer 40 and the chip select signal buffer 50 in response to the first and third clock enable signals CKE1 and CKE3 when the flag signal FG disabled to a low level is input before or after the all bank refresh operation.

On the other hand, when the flag signal FG enabled to a high level is input in the all bank refresh operation, the buffer enable signal generator 233 generates the first buffer enable signal BEN disabled to a low level and the second buffer enable signal BENB disabled to a high level to stop the operations of the clock buffer 30, the command address buffer 40 and the chip select signal buffer 50.

Figure 7:
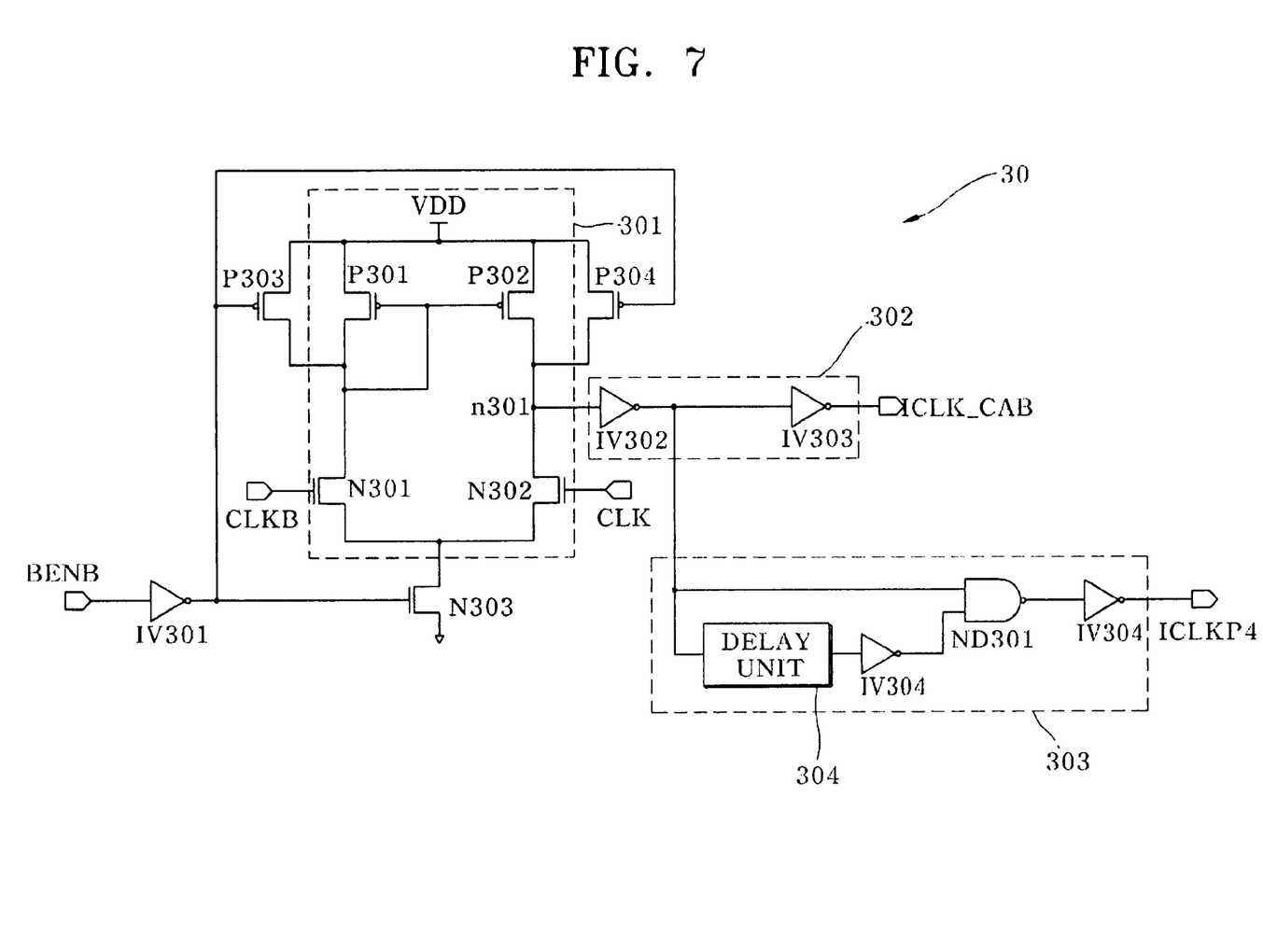
FIG. 7 is a diagram illustrating an example of a clock buffer in the refresh signal generating circuit of FIG. 2.

An example of the clock buffer 30 as illustrated in FIG. 7 includes a first level shifter 301 for level-shifting the external clocks CLK and CLKB to a power supply voltage VDD level, a NMOS transistor N303 and PMOS transistors P303 and P304 for controlling the operation of the first level shifter 301 in response to an inverse signal of the second buffer enable signal BENB, a first internal clock generator 302 for buffering the level-shifted external clocks CLK and CLKB and generating the first internal clock ICLK_CAB, and a second internal clock generator 303 for adjusting a pulse width of the level-shifted external clocks CLK and CLKB and generating the second internal clock ICLKP4 which has a different pulse width from the first internal clock ICLK_CAB. Here, the second internal clock ICLKP4 is delayed by a predetermined time by delay unit 304 such that it has an identical cycle to the first internal clock ICLK_CAB but a different pulse width from the first internal clock ICLK_CAB.

The clock buffer 30 of FIG. 7 generates the first and second internal clocks ICLK_CAB and ICLKP4 when the second buffer enable signal BENB of low level is input before or after the all bank refresh operation. On the other hand, when the second buffer enable signal BENB of high level is input in the all bank refresh operation, the NMOS transistor 303 is turned off and the PMOS transistors P303 and P304 are turned on, thus stopping the operation of the first level shifter 301. Therefore, through the turned-on PMOS transistor P304, the first internal clock ICLK_CAB is set to a high level and the second internal clock ICLKP4 is set to a low level.

The command address buffer 40 comprises a command address receiver 41, a second delay unit 42 and a first latch unit 43.

Figure 8:
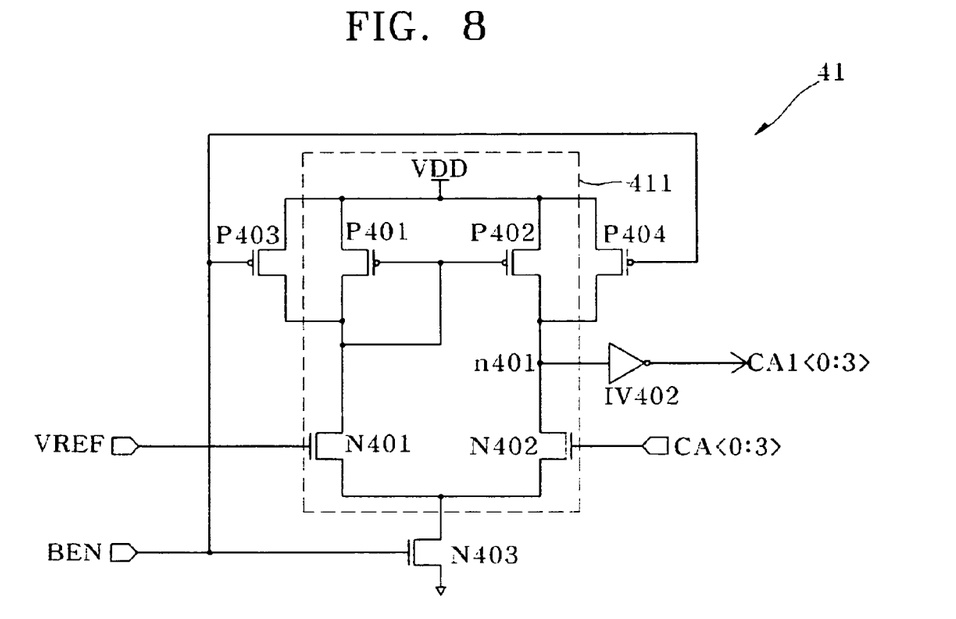
FIG. 8 is a diagram illustrating an example of a command address receiver in the refresh signal generating circuit of FIG. 2.

An example of the command address receiver 41 as illustrated in FIG. 8 includes a first comparing unit 411 for comparing the external command address signals CA<0:3> with the reference voltage VREF and driving the node n401, an inverter IV402 for inverting an output signal of the node n401 and generating the first command address signals CA<0:3>, an NMOS transistor N403 and PMOS transistors P403 and P404 for controlling the operation of the first comparing unit 411 in response to the first buffer enable signal BEN. Here, the reference voltage VREF is set to a middle level between the high level and low level of the external command address signals CA<0:3>.

The first comparing unit 411 drives the node n401 in response to the first buffer enable signal BEN of high level which is generated before or after the all bank refresh operation, and inverts an output signal of the node n401, to generate the first command address signals CA1<0:3>. On the other hand, the first comparing unit 411 sets the node n401 to a high level through the turned-on PMOS transistor P404 in response to the first buffer enable signal BEN of low level which is generated in the all bank refresh operation, thereby setting the first command address signals CA1<0:3:> to a low level.

The second delay unit 42 delays the first command address signals CA1<0:3> to secure a setup/hold time and generates a second command address signals CA2<0:3>. The second delay unit 42 can be configured as a general delay circuit.

The first latch unit 43 latches the second command address signals CA2<0:3> and outputs it to the command decoder 60 in response to the first internal clock ICKL_CAB. The first latch unit 43 can be configured as a general latch circuit.

Figure 9:
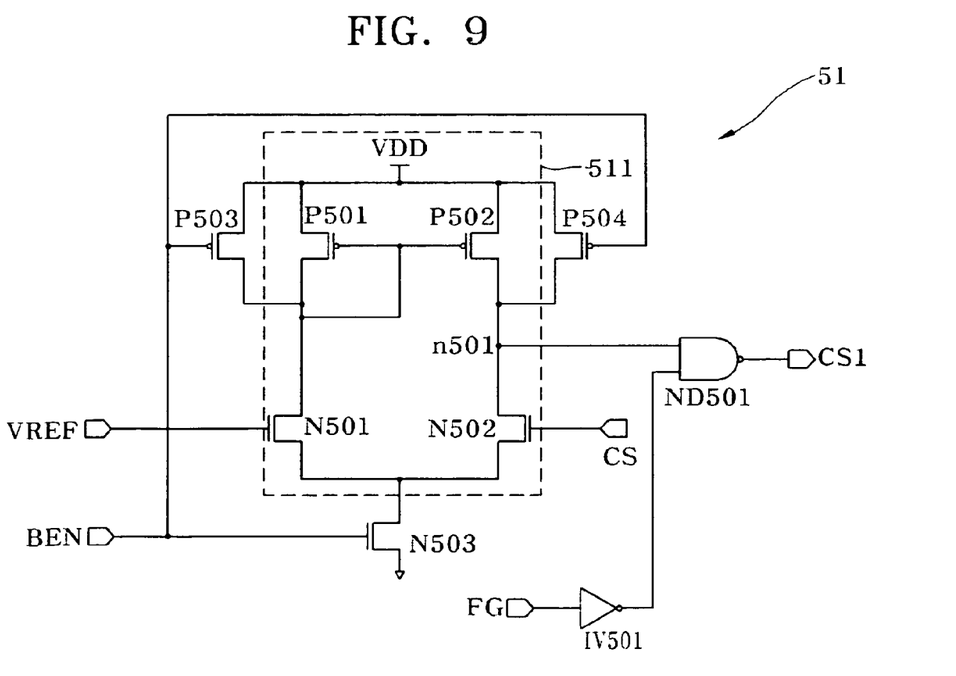
FIG. 9 is a diagram illustrating an example of a chip select signal receiver in the refresh signal generating circuit of FIG. 2.

An example of the chip select signal receiver 51 as illustrated in FIG. 9 comprises a second comparing unit 511 for comparing an external chip select signal CS with the reference voltage VREF and driving the node n501, a NAND gate ND501 for performing a NAND operation with respect to an output signal of the node n501 and an inverse signal of the flag signal FG and generating the first chip select signal CS1, an NMOS transistor N503 and PMOS transistors P503 and P504 for controlling the operation of the second comparing unit 511 in response to the first buffer enable signal BEN. Here, the reference voltage VREF is set to a middle level between the high level and low level of the external chip select signal CS.

Before or after the all bank refresh operation, the second comparing unit 511 is enabled in response to the first buffer enable signal BEN of high level, and the NAND gate ND501 is operated as an inverter by the flag signal FG of low level. Therefore, the external chip select signal CS is buffered through the second comparing unit 511 and the NAND gate ND501 and is output as the first chip select signal CS1.

On the other hand, in the all bank refresh operation, the second comparing unit 511 is disabled in response to the first buffer enable signal BEN of low level, and the NAND gate ND501 fixes the first chip select signal CS1 to a high level in response to the flag signal FG of high level.

The third delay unit 52 delays the first chip select signal CS1 to secure a setup/hold time and generates a second chip select signal CS2. The third delay unit 52 can be configured as a general delay circuit.

Figure 10:
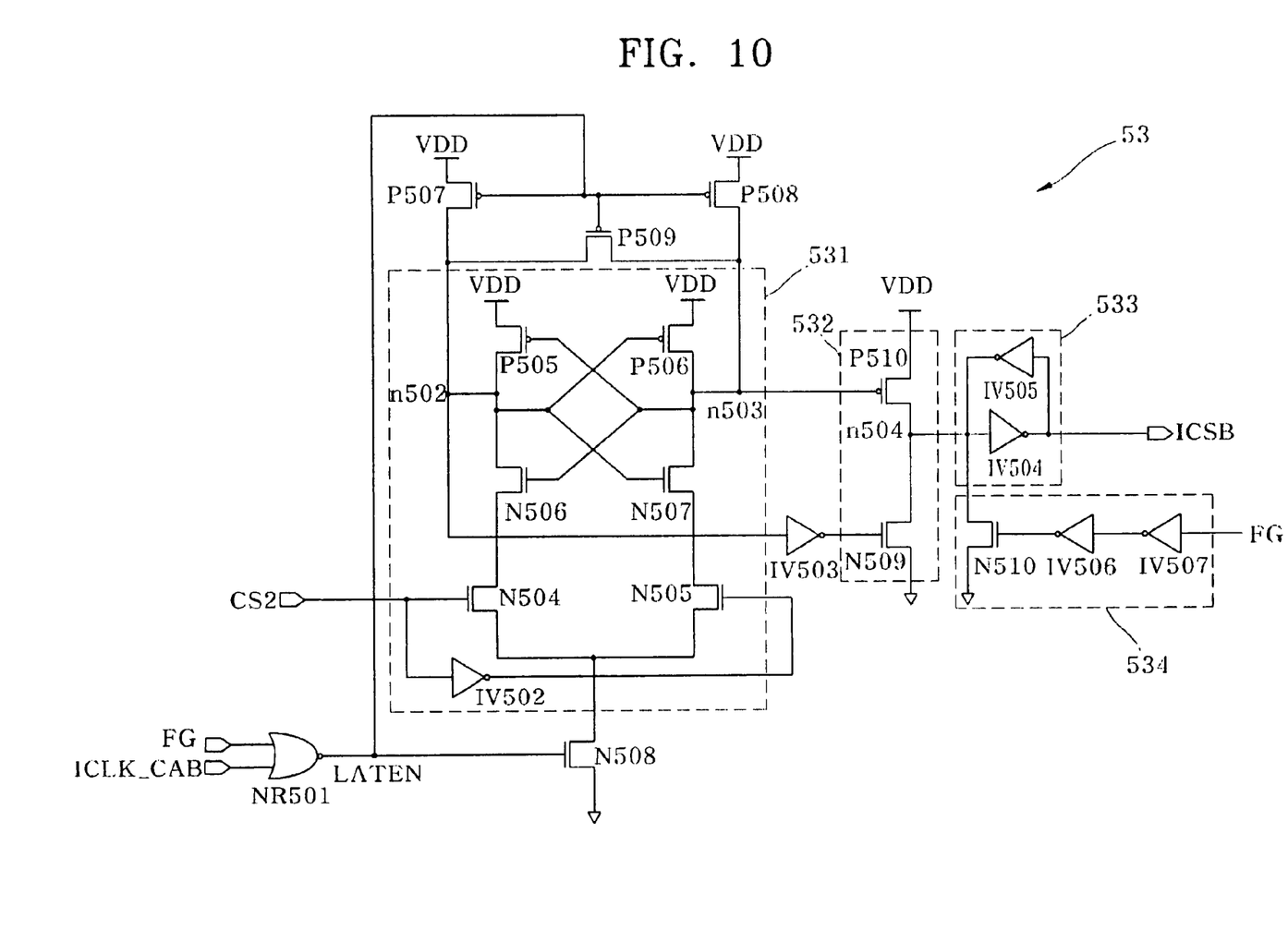
FIG. 10 is a diagram illustrating an example of a latch unit of the chip select signal buffer in the refresh signal generating circuit of FIG. 2.

An example of the second latch unit 53 as illustrated in FIG. 10 comprises a second level shifter 531 for level-shifting the second chip select signal CS2 to a power supply voltage VDD level and outputting it to nodes n502 and n503, a second driving unit 532 for driving a node n504 in response to output signals of the nodes n502 and n503, respectively, a latch 533 for latching an output signal of the node n504 and generating an internal chip select signal ICSB, a NOR gate NR501 for performing a NOR operation with respect to the flag signal FG and the first internal clock ICLK_CAB and generating a latch enable signal LATEN, and an NMOS transistor N508 and PMOS transistors P507 and P508 for controlling the operation of the second level shifter 531 in response to the latch enable signal LATEN.

In addition, the second latch unit 53 further includes a level setting unit 534 for setting the node n504 to a low level in response to the flag signal FG enabled to a high level, to fix the internal chip select signal ICSB to a high level.

When the flag signal FG of low level is input before or after the all bank refresh operation, the second level shifter 531 receives the second chip select signal CS2 and performs a level shifting operation. On the other hand, when the flag signal FG of high level is input in the all bank refresh operation, the second level shifter 531 stops the level shifting operation. In this case, since the node n504 becomes a floating state, the level setting unit 534 sets the internal chip select signal ICSB to a high level. Therefore, in the all bank refresh operation, the command decoder 60 does not generate an unnecessary all bank refresh signal AREFP in response to the internal chip select signal ICSB of high level.

Figure 11:
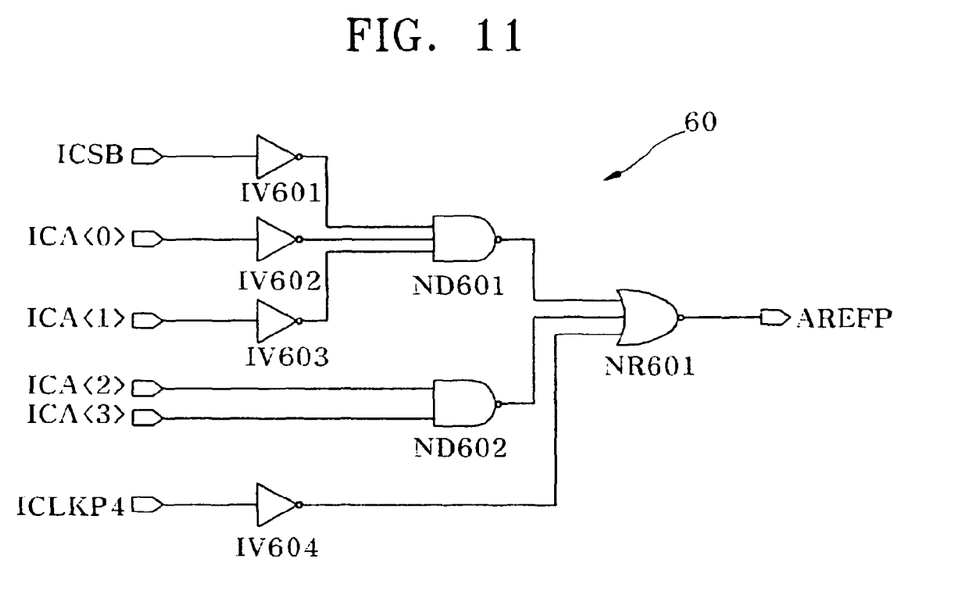
FIG. 11 is a diagram illustrating an example of a command decoder in the refresh signal generating circuit of FIG. 2.

An example of the command decoder 60 as illustrated in FIG. 11 comprises a NAND gate ND601 which receives an inverse signal of the internal chip select signal ICSB, an inverse signal of the first internal command address signal ICA<0> and an inverse signal of the second internal command address signal ICA<1> and performs a NAND operation, a NAND gate ND602 which receives the third internal command address signal ICA<2> and the fourth internal command address signal ICA<3> and performs a NAND operation, and a NOR gate N601 which performs a NOR operation with respect to output signals of the NAND gates ND601 and ND602, respectively, and an inverse signal of the second internal clock ICLKP4 and generates the all bank refresh signal AREFP.

In order for the command decoder 60 of FIG. 11 to generate the all bank refresh signal AREFP of high level pulse signal, the internal chip select signal ICSB, the first internal command address signal ICA<0>, the second internal command address signal ICA<1>, the third internal command address signal ICA<2> and the fourth internal command address signal ICA<3> should be input in a low level, a low level, a low level, a high level and a high level, respectively.

Hereinafter, operation of the refresh signal generating circuit configured as described above, before the all bank refresh operation and in the all bank refresh operation, will be described with reference to FIG. 12.

First, before the all bank refresh operation, the all bank refresh signal AREFP and the precharge signal PCGP are in a low level. However, since the flag signal generator 10 has already latched the flag signal FG to a low level in response to the previously input precharge signal PCGP of high level, it outputs the flag signal FG disabled to a low level.

The control unit 23 generates the enable signals EN and ENB in response to the first internal clock ICLK_CAB from the clock buffer 30. The control unit 23 generates the third clock enable signal CKE3 by delaying the second clock enable signal CKE2 which has been delayed to secure a setup/hold time in the first delay unit 22, by two cycles of the enable signals EN and ENB in response to the enable signals EN and ENB. The control unit 23 receives the third clock enable signal CKE3, the first clock enable signal CKE1 and the flag signal FG and generates the first and second buffer enable signals BEN and BENB. Here, when the flag signal FG is input in a low level, the first and second buffer enable signals BEN and BENB are generated in response to the first clock enable signal CKE1 and the third clock enable signal CKE3.

The command address buffer 40 buffers and delays the external command address signals CA<0:3> in response to the first buffer enable signal BEN and generates the internal command address signals ICA<0:3>.

Since the NAND gate ND501 operates as an inverter in response to the flag signal FG of high level, the chip select signal receiver 51 buffers the external chip select signal CS through the second comparing unit 511 and the NAND gate ND501 in response to the first buffer enable signal BEN and generates the first chip select signal CS1. The first chip select signal CS1 is delayed in the third delay unit 52 to secure a setup/hold time and is generated as the second chip select signal CS2.

Since the NOR gate NR501 operates as an inverter in response to the flag signal FG of low level, the second latch unit 53 generates the internal chip select signal ICSB through the second level shifter 531, the second driving unit 532 and the latch 533 in response to the first internal clock ICLK_CAB.

The clock buffer 30 level-shifts and delays the external clocks CLK and CLKB in response to the second buffer enable signal BENB and generates the first and second internal clocks ICLK_CAB and ICLKP4 which have an identical cycle but a different pulse width from each other. Here, the clock enable signal buffer 20, the command address buffer 40 and the chip select signal buffer 50 operate in synchronization with the first internal clock ICLK_CAB and the command decoder 60 operates in synchronization with the second internal clock ICLKP4.

Figure 12:
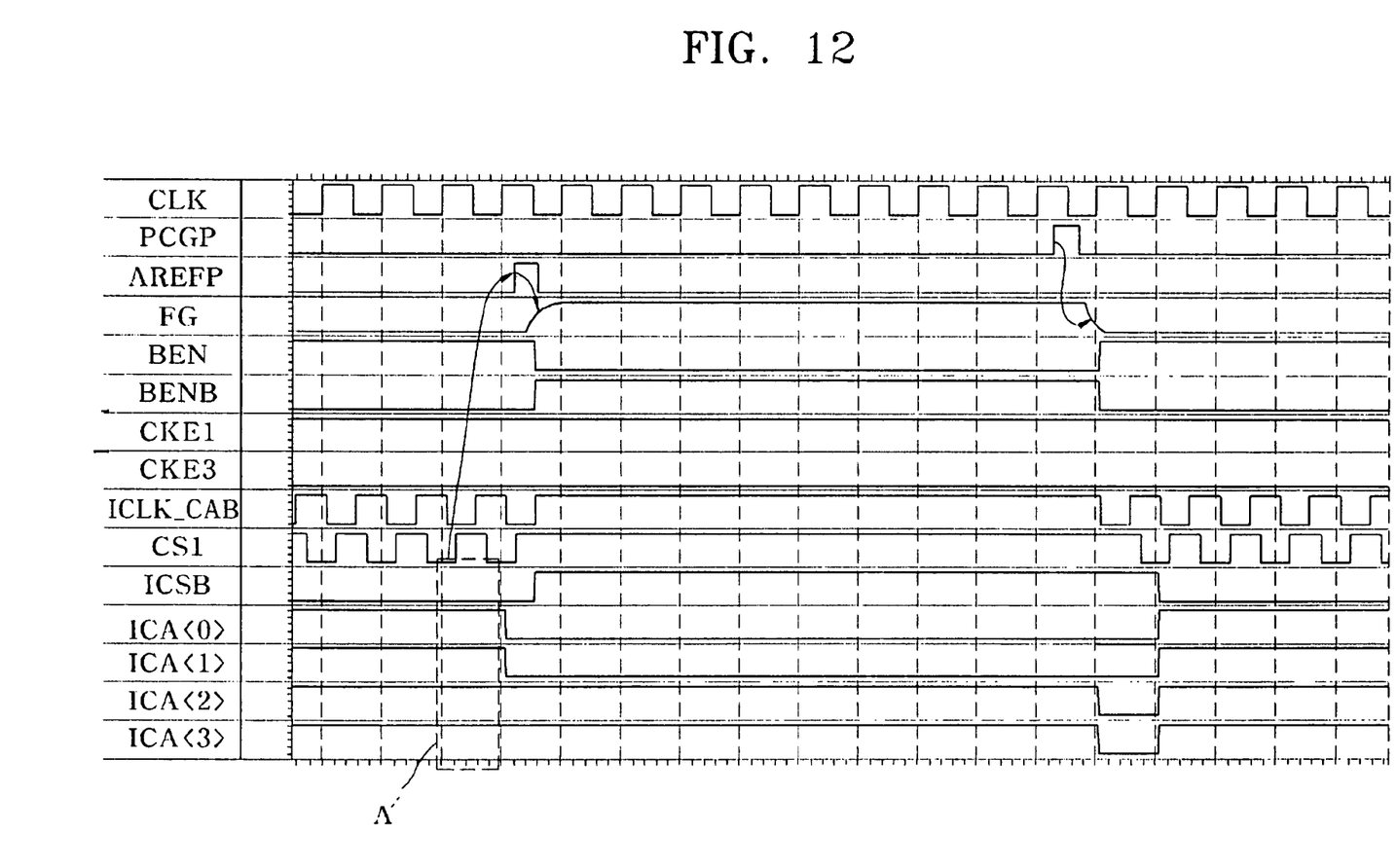
FIG. 12 is a waveform showing signals for explaining an operation of the refresh signal generating circuit of FIG. 2.

The command decoder 60 generates the all bank refresh signal AREFP of high level pulse signal when the internal chip select signal ICSB, the first internal command address signal ICA<0>, the second internal command address signal ICA<1>, the third internal command address signal ICA<2> and the fourth internal command address signal ICA<3> are input in a low level, a low level, a low level, a high level and a high level, respectively, as shown in A of FIG. 12.

Next, in the all bank refresh operation, the flag signal generator 10 generates the flag signal FG enabled to a high level in response to the all bank refresh signal AREFP of high level.

The control unit 23 disables the first buffer enable signal BEN to a low level and the second buffer enable signal BENB to a high level in response to the flag signal FG. More specifically, the buffer enable signal generator 233 sets the first buffer enable signal BEN to a low level and the second buffer enable signal BENB to a high level regardless of the voltage level of the first and third clock enable signals CKE1 and CKE3 when the flag signal FG is input in a high level.

The command address buffer 40 generates the internal command address signals ICA<0:3> of low level in response to the first buffer enable signal BEN of low level. In more detail, the command address receiver 41 sets the first command address signals CA1<0:3> to a low level in response to the first buffer enable signal BEN of low level. The first command address signals CA1<0:3> is delayed in the second delay unit 42, latched in the first latch unit 43 and output as the internal command address signals ICA<0:3> of low level.

Since the NAND gate ND501 responds to the flag signal FG of low level before an operation of the second comparing unit 511 stops in response to the first buffer enable signal BEN of low level, the chip select signal receiver 51 sets the first chip select signal CS1 to a high level.

In the second latch unit 53, since the NOR gate NR501 generates the latch enable signal LATEN of high level in response to the flag signal FG of high level, an operation of the second level shifter 531 stops in response to the latch enable signal LATEN and the level setting unit 534 sets the node n504 to a low level in response to the flag signal FG, thus fixing the internal chip select signal ICSB to a high level.

The clock buffer 30 stops an operation of the first level shifter 301 in response to the second buffer enable signal BENB of high level. Accordingly, the generation of the first and second internal clocks ICLK_CAB and ICLKP4 is stopped.

The command decoder 60 receives the internal command address signals ICA<0:3> of low level and the internal chip select signal ICSB of high level and thus does not generate the all bank refresh signal AREFP of high level.

As described above, when the flag signal FG of high level is generated in response to the all bank refresh signal AREFP of high level, the first buffer enable signal BEN of low level and the second buffer enable signal BENB of high level are generated in response to this flag signal FG. Accordingly, the operation of the command address buffer 40 and chip select signal buffer 50 is stopped by the first buffer enable signal BEN, and the operation of the clock buffer 30 is stopped by the second buffer enable signal BENB, thereby preventing unnecessary current consumption in the all bank refresh operation.

Meanwhile, when the precharge signal PCGP of high level pulse signal is input at the completion of the all bank refresh operation, the flag signal generator 10 generates the flag signal FG of low level again in response to the precharge signal PCGP, and the control unit 23 normally generates the first and second buffer enable signals BEN and BENB in response to this flag signal FG. Accordingly, in response to the first and second buffer enable signals BEN and BENB, the operations of the clock buffer 30, the command address buffer 40 and the chip select signal buffer 50 resume.

Although examples and exemplary embodiments of the present invention have been described for illustrative purposes, those skilled in the art will appreciate that various modifications, additions and substitutions are possible, without departing from the scope and spirit of the invention as disclosed in the accompanying claims.

The present disclosure claims priority to Korean application 10-2008-0061907, filed on Jun. 27, 2008 the entire contents of which are incorporated herein by reference.

What is claimed is:

1. A refresh signal generating circuit comprising:
   a flag signal generator for generating a flag signal in response to a refresh signal and a precharge signal;

a clock enable signal buffer for generating first and second buffer enable signals based on an external clock enable signal in response to the flag signal; and a chip select signal buffer for generating an internal chip select signal based on an external chip select signal in response to the flag signal.

2. The refresh signal generating circuit of claim 1, wherein the flag signal generated by the flag signal generator is enabled in an all bank refresh operation.

3. The refresh signal generating circuit of claim 2, wherein the flag signal generated by the flag signal generator is disabled at the completion of the all bank refresh operation.

4. The refresh signal generating circuit of claim 1, wherein the flag signal generator includes:

a driving unit for selectively generating the flag signal in response to the refresh signal and the precharge signal; and a latch for latching the flag signal.

5. The refresh signal generating circuit of claim 1, wherein the first and second buffer enable signals generated by the clock enable signal buffer are disabled in an all bank refresh operation.

6. The refresh signal generating circuit of claim 1, further comprising a clock buffer which generates first and second internal clocks based on an external clock in response to the first buffer enable signal.

7. The refresh signal generating circuit of claim 6, wherein the clock buffer stops generation of the first and second internal clocks in an all bank refresh operation.

8. The refresh signal generating circuit of claim 1, further comprising a command address buffer which generates an internal command address signal based on an external command address signal in response to the second buffer enable signal.

9. The refresh signal generating circuit of claim 8, wherein the internal command address signal generated by the command address buffer is disabled to a first voltage level regardless of the external command address signal in an all bank refresh operation.

10. The refresh signal generating circuit of claim 1, wherein the internal chip select signal generated by the chip select signal buffer is set to a second voltage level regardless of the external chip select signal in an all bank refresh operation.

* * * * *